(12) United States Patent
Brown et al.

(10) Patent No.: US 6,799,868 B2
(45) Date of Patent: Oct. 5, 2004

(54) LASER FLASHLIGHT

(75) Inventors: David C. Brown, Brackney, PA (US); Richard J. Nelson, Manchester, CT (US); Titus A. Casazza, Glastonbury, CT (US); Jay Kehoe, Glastonbury, CT (US)

(73) Assignee: LE Systems, Inc., East Hartford, CT (US)

( * ) Notice: Subject to any disclaimer, the term of this patent is extended or adjusted under 35 U.S.C. 154(b) by 0 days.

(21) Appl. No.: 10/631,229

(22) Filed: Jul. 31, 2003

(65) Prior Publication Data

US 2004/0130896 A1 Jul. 8, 2004

Related U.S. Application Data

(63) Continuation of application No. 10/162,033, filed on Jul. 26, 2002, now Pat. No. 6,616,301, which is a division of application No. 09/706,911, filed on Nov. 7, 2000, now Pat. No. 6,431,732, which is a continuation of application No. 09/111,335, filed on Jul. 7, 1998, now Pat. No. 6,142,650.

(60) Provisional application No. 60/052,159, filed on Jul. 10, 1997.

(51) Int. Cl.[7] ............................................. F21K 27/00
(52) U.S. Cl. ...................... 362/259; 362/109; 362/553
(58) Field of Search ............................... 362/259, 109, 362/116, 118, 553, 555, 110; 353/42, 43; 372/22

(56) References Cited

U.S. PATENT DOCUMENTS

| | | | |
|---|---|---|---|
| 4,186,851 A | 2/1980 | Cantor | 222/113 |
| 4,842,277 A | 6/1989 | LaCroix | 273/84 |
| 4,843,336 A | 6/1989 | Kuo | 340/521 |
| 5,052,801 A | 10/1991 | Downes, Jr. et al. | 356/153 |
| 5,072,342 A | 12/1991 | Minovitch | 362/111 |
| 5,222,798 A | 6/1993 | Adams | 362/110 |
| 5,237,773 A | 8/1993 | Claridge | 42/103 |
| 5,243,894 A | 9/1993 | Minovitch | 89/111 |
| 5,343,376 A | 8/1994 | Huang | 362/259 |
| 5,364,097 A | 11/1994 | Lyon | 273/84 |
| 5,381,430 A | 1/1995 | Nozaki et al. | 359/21 |
| 5,396,069 A | 3/1995 | Craig et al. | 250/330 |
| 5,685,636 A | 11/1997 | German | 362/259 |
| 6,007,218 A | 12/1999 | German et al. | 362/259 |
| 6,142,650 A | 11/2000 | Brown et al. | 362/259 |

*Primary Examiner*—Euncha Cherry
(74) *Attorney, Agent, or Firm*—Patent Law Office of David G. Beck

(57) ABSTRACT

A laser flashlight employs an emitter disposed within a housing for emitting a coherent light beam having a gaussian spatial profile along an optical axis toward the exit face of the housing. An optical system disposed within the housing intermediate the emitter and the exit face of the housing includes a laser element pumped by the emitter, a frequency/wavelength converter, and a resonator, to form the coherent light into a laser beam. A beam expander receives the laser beam, disperses the laser beam, and transmits the dispersed laser beam from the light emitting end of the housing into the ambient environment.

25 Claims, 6 Drawing Sheets

LASER FLASHLIGHT

PRIORITY CLAIM

This application is a continuation of U.S. patent application Ser. No. 10/162,033, filed Jul. 26, 2002, now U.S. Pat. No. 6,616,301, which is a divisional of U.S. patent application Ser. No. 09/706,911 filed Nov. 7, 2000 and issued as U.S. Pat. No. 6,431,732, which is a continuation of U.S. patent application Ser. No. 09/111,335, filed Jul. 7, 1998 and issued as U.S. Pat. No. 6,142,650, which claimed priority from U.S. Provisional Patent Application Ser. No. 60/052,159, filed Jul. 10, 1997.

BACKGROUND OF THE INVENTION

The present invention generally relates to the field of portable illumination devices for illuminating an ambient environment. More specifically, the present invention is directed to a hand-held laser flashlight which illuminates an ambient environment while minimizing the risk of causing irreversible eye damage.

Law enforcement, corrections, and military personnel face increasingly greater threats in their daily activities. Routine traffic stops can end in officers finding themselves in life-threatening situations. Domestic disputes and drug enforcement activities are amongst the most dangerous law enforcement personnel face. Also, increasingly law enforcement personnel face situations such as riots or unruly groups of individuals where certain lethal options cannot be used or would only serve to further exacerbate the situation. The availability of non-lethal weapons expands the range of options available to law enforcement in reacting to potentially violent or life-threatening situations.

Hand-held flashlights have been in widespread usage in many areas for many years. For example, in the area of forensics, law enforcement personnel have found flashlights to be so useful that incandescent flashlights have become "standard issue." These "standard issue" flashlights produce a bright beam from a small and relatively light-weight package. Such "standard issue" flashlights have, inter alia, been used by law enforcement personnel to illuminate crime scenes, to disorient and confuse suspects and to physically subdue suspects.

The effect of laser light on human eyesight can be separated into three categories: glare effects, dazzling or flashblinding, and permanent damage. The retinal damage threshold in general depends upon the laser wavelength, the exposure duration, and whether or not the laser is operated in continuous wave or pulsed or modulated mode and, if pulsed, the repetition rate and the pulse duration. If the laser light intensity is such that the damage threshold for the eye is exceeded, lesions are produced that are permanent. This damage occurs at the location of the retina for visible and near-infrared light. Ultraviolet and far-infrared light on the other hand are absorbed in the cornea and the light never reaches the retina.

The exact intensities where glare stops and dazzling occurs are difficult to define with precision and depend to a large extent on the individual involved. In general, however, glare occurs first and results in little or no loss of vision performance. In fact, after a laser source is turned off, in the glare region no after-effects or latent images occur. If the intensity is increased, however, at some intensity or over a range of intensities, dazzling occurs. If the laser is turned off, short-term partial loss of vision occurs, typically lasting for seconds or tens of seconds. At still greater intensities the after-effect is substantially longer, perhaps as long as-minutes. This effect is best compared to the use of a fundus camera to photograph the retina of the human eye, usually under fully dilated conditions. Substantial vision loss can occur and last for many minutes.

Some inroads have also been made in applying laser technology to portable illumination devices in limited areas. One major drawback of such uses of lasers has been that the laser beam emitted by such low-power devices has the potential to produce irreversible eye damage if a person gazes directly into the light source. Thus, these devices are not "eyesafe." Naturally, this problem becomes exacerbated as attempts are made to increase the output power of such devices. Another significant limitation associated with such portable laser emitting devices is that they have, to date, been unable to produce nearly as much light as comparably sized incandescent flashlights. Accordingly, their lack of versatility and overall poor performance has limited their use.

The desirability of producing glare or flashblind effects, whereby a temporary reduction to visual performance results from exposure to laser light, has been disclosed, among others, by German in U.S. Pat. No. 5,685,636. However, the laser flashlight device as described by German suffers from a number of critical deficiencies, especially with regard to the laser safety aspects associated with its intended use as a portable visual security device against mobile targets. For example, the eye safety of the radiation produced with the portable laser security device of German, could only be assured beyond a certain range, which, at the minimum, is set at 3 m. Thus, to keep the intensity below 58.3 mW/cm$^2$, the upper limit recited as corresponding to permanent undesirable damage to the eye, would require spot size diameters of at least 5 cm for power levels beyond 1 W. Since the damage threshold decreases as the exposure time increases (FIG. 1 of U.S. Pat. No. 5,685,636) the operational range of power must be reduced and/or the beam spread parameter increased to assure safety at exposure times which may be longer than 100 msec.

German teaches that the spot size is to be adjusted using a movable collimating lens contained within the apparatus, with the explicit purpose of reducing the laser beam spread produced by a semiconductor laser with a highly divergent beam. Clearly, such manual adjustments may be difficult to realize in real life situations where rapidly moving intruders are encountered. It will require the operator to guess the likely range of the target while taking additional care to ascertain that the range always exceed a minimum value even as the exposure duration is kept short enough to avoid permanent eye damage, yet long enough to produce the desired deterrent effect. These are clearly difficult conditions to fulfil in high stress situations where rapid response times are essential.

In terms of the effectiveness of the laser flashlight in use as a non-lethal security device, the embodiments and methods of operation as taught by German again fall short. In particular, whereas it was appreciated that shorter wavelengths are more effective in producing the desired glare and flashblind effects, requiring less power than a red semiconductor laser, no disclosure was provided with regard to either methods and/or structures for producing said shorter wavelengths laser devices, in particular, at the green wavelengths recognized as especially effective for this application.

It may be noted that the specific example provided, namely the laser produced by Santa Fe lasers, is neither compact enough to be provided within a standard flashlight package, nor is it capable of producing the desired eye safety features. In particular, it must further be noted that with regard to the green radiation produced by frequency doubled, diode pumped solid state laser, it is well known in the art that the beam properties from such a laser are very different than those produced by typical diode lasers. For example, the laser radiation of a solid state laser tends to be much less divergent, having a higher degree of spatial coherence than the output of a diode laser. Consequently the collimating lens described by German as the critical element for reducing the spread of a laser beam is entirely incompatible with the near diffraction limited radiation produced from most crystalline solid state laser. In fact, use of such a short focal length lens may result in drastic focusing effects leading to smaller beam spot sizes and therefore much higher intensities even at the longest ranges cited by German, thereby severely compromising eye safety. It was clearly not realized by German that use of a movable collimating or focusing lens as a means for adjusting the beam spread of the laser device is insufficient to assure eye safety at arbitrary ranges from the solid state laser device. Although other optical elements may be envisioned that may be capable of increasing rather than decreasing the beam spread, no such elements were described in the German patent, yet the choice of a specific such optical element represents an essential design feature for the security applications contemplated.

Alternative prior art that directed to portable laser applications also fail to fulfil the requirements of a safe and effective laser flashlight. For example, U.S. Pat. No. 5,396,069 to Craig et al describes a packaged solid state laser device for use as a portable night vision apparatus. The laser disclosed therein does not include beam shaping or other optics necessary to assure eye safety at all power levels. In particular Craig teaches that his device specifically requires eye safety warning labels, and that such device is recognized not to be eye safe when used with the recommended light source, in this case a diode laser of power up to 50 mW. Craig also teaches a variable focus adjustment system, which is at the operator's disposal. Clearly, such adjustments will be difficult to execute manually and still provide an output intensity that is an effective deterrent against a moving target, while also assuring safety according to accepted ANSI standard for a given exposure duration. Furthermore, none of the embodiments shown conform to a standard flashlight packaging constraints imposed herein. Other compact solid state laser have been described in the literature, but none that would have the necessary eye safety features at sufficiently high power levels to provide only reversible flashblinding or glare effects.

It should be readily appreciated that to guarantee eye safety under all conditions, a laser flashlight used as a security device against moving human targets must be eye safe at the aperture, or right at the exit face of the flashlight device. Only then can the operator be assured that the laser radiation would not produce permanent, lethal eye damage at any range, for a given set of power settings, selected to provide the desired effects. Yet, without such assurance, the likelihood of use of said flashlight by law enforcement personnel is not very high. None of the laser technologies or commercially available devices known in the current art include the requisite fail safe mechanism for assuring both automatic safety and effectiveness.

SUMMARY OF THE INVENTION

Briefly stated, the invention in a preferred form is a laser flashlight for emitting an eyesafe light dispersion pattern into the eyes of a person. The laser flashlight employs an emitter disposed within the flashlight housing for emitting a coherent light beam along an optical axis toward the exit face of the housing. An optical system, disposed along the optical axis intermediate the emitter and the exit face, is configured to provide an output laser beam having a spatial profile that is substantially gaussian. A light transmissive beam expander, disposed along the optical axis proximate to the exit face of the housing, is configured to limit the intensity of the output laser beam at the eyes of the person, for any power of the emitter, up to and including the maximum power of the emitter, to a level which is always less than the ANSI safety standard adapted for the wavelength of the output laser beam.

In different embodiments of the laser flashlight of the present invention, the emitter and the optical path configuration can be either a diode laser optically connected to an optical fiber or, alternatively, a diode laser or laser array pumping a solid state crystal disposed within an optical resonator. The optical system may also include one or more lenses to focus the coherent light emitted by the emitter on a laser crystal. Thus, the emitter can be directly coupled to the beam expander via an optical fiber or coupled therewith using a resonator. Further, the laser beam emitted by the flashlight may be either continuous wave or pulsed.

The laser resonator comprising the optical system of the flashlight may further include a harmonic generating crystal to shift the wavelength of the laser beam to either a longer or shorter spectral range. In alternative embodiments, the harmonic generating crystal may be a nonlinear or a linear wavelength shifting element. Preferably, and optimally when the flashlight is used as a security device, the harmonically generated light has a wavelength in the visible range, close to the green portion of the spectrum where light sensitivity of the eye is at a maximum. In such a laser flashlight, the optical system preferably includes optical coatings designed to reverse the direction of the harmonic light which is traveling back toward the emitter to thereby increase the efficiency of the flashlight.

It is, accordingly, an object of the present invention to provide an eyesafe laser flashlight which will not produce irreversible eye damage if a person gazes directly into the flashlight.

It is a further object of the present invention to provide a portable laser flashlight having the general size, shape and weight characteristics of a "standard issue" incandescent flashlight used by law enforcement personnel.

It is still another object of the present invention to provide a hand-held laser flashlight which is capable of emitting significantly more light than prior hand-held laser-based illumination devices to thereby enable the laser flashlight to be effectively used over longer distances and/or to illuminate larger areas.

It is yet another object of the present invention to provide a portable laser flashlight having at least one laser emitter that can be modulated in either periodic or random fashion to more efficiently produce a bright beam of light.

It is an additional object of the present invention to provide an eyesafe portable laser flashlight which employs at least one laser emitter and is capable of operating at more than one output wavelength.

It is still another object of the present invention to provide a hand-held laser flashlight which provides an optimal combination of (a) simplicity; (b) reliability; (c) durability; (d) versatility; and (e) efficiency.

Numerous other advantages and features of the present invention will become apparent to those of ordinary skill in the art from the following detailed description of the invention, from the claims and from the accompanying drawings.

It is still another object to of the present invention to provide a portable laser flashlight including the feature of constant brightness over a range of power settings. This feature enables variation of the power settings without affecting the beam spread, thereby assuring eye safety even at the highest power settings.

BRIEF DESCRIPTION OF THE DRAWINGS

The preferred embodiments of the present invention will be described below with reference to the accompanying Figures wherein like numerals represent like structures and wherein.

DETAILED DESCRIPTION OF THE PREFERRED EMBODIMENTS

Figure 1:
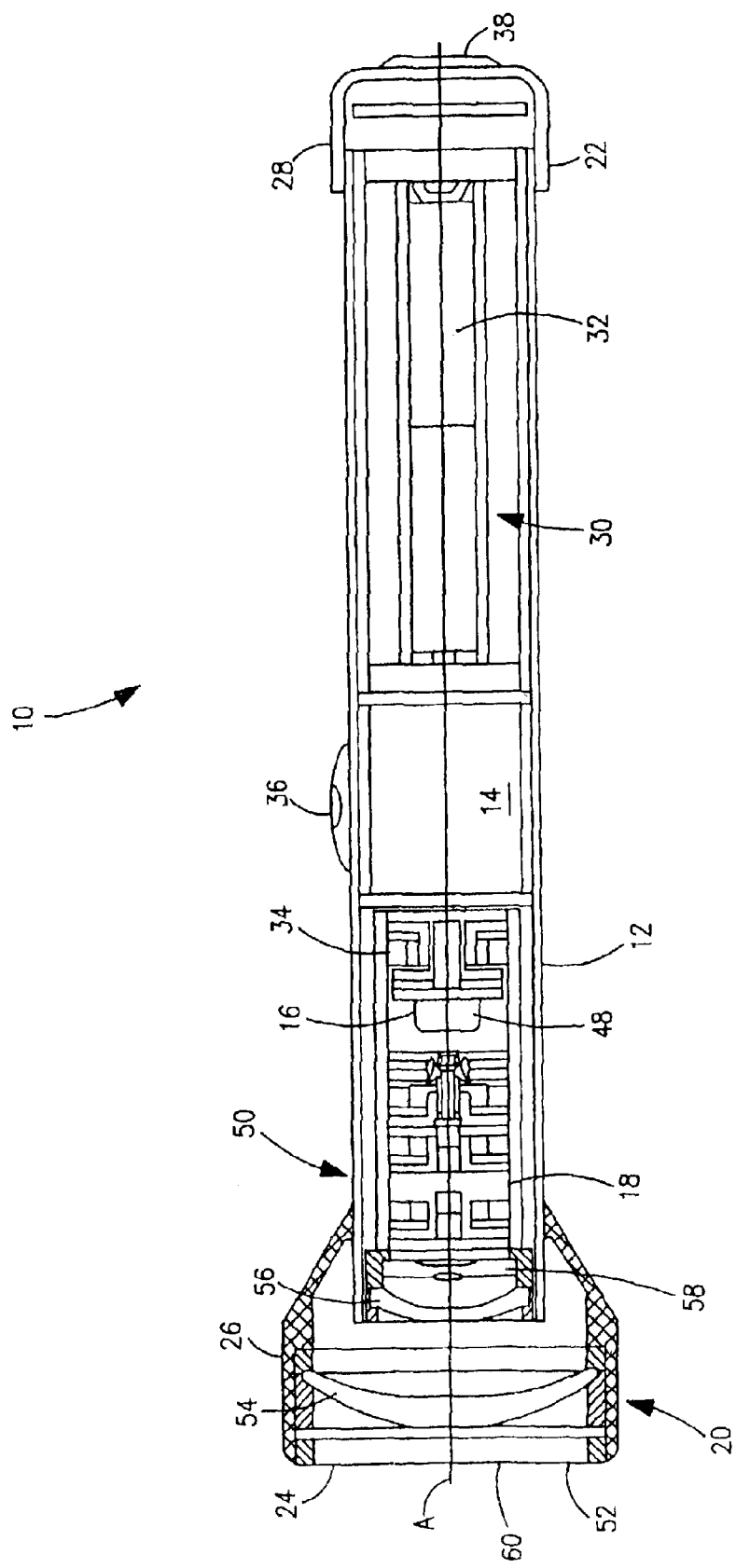
FIG. 1 is a cross-sectional side elevation view of a first preferred embodiment of the laser flashlight of the present invention.

A laser flashlight 10 in accordance with a first preferred embodiment of the present invention will be described below with reference to FIG. 1. As shown therein, laser flashlight 10 generally includes a housing 12, a power supply 14, a diode source, or package 16, a resonator 18 and a beam expander 20. As shown, these components are preferably axially aligned along an axis A which is defined by the direction of travel of laser beams emitted from diode package 16. Housing 12 comprises a generally cylindrical main body coaxially disposed about axis A, a first end 22, a second light emitting end or aperture 24, a lens-retaining shell 26 disposed at the second end 24 and an end cap 28 disposed at the first end 22.

A battery pack 30 having a plurality of batteries 32 is disposed within the housing 12 to supply electricity to a variety of components. In particular, battery pack 30 preferably includes six 1.2 volt 3 amp nickel metal hydride rechargeable batteries 32 commercially available from Duracell Corporation in size 4/3A with Model No. DH43289. Two of the six batteries 32 are connected in series to drive diode package 16. The remaining four batteries 32 are connected to supply electricity to the electronics associated with the power supply 14 as well as to the thermoelectric cooling (TEC) unit 34 used to cool the diode package 16. Battery pack 30 should yield approximately two hours of operating time depending on the particular diode package 16 and TEC unit 34 employed.

Electricity is applied to the diode package 16 and the TEC unit 34 from battery pack 30 via the power supply 14. Power supply 14 preferably includes electrical conductors as known in the art and an on/off switch 36 for selectively interrupting the flow of electricity from battery pack 30. To modulate the production of laser beams by the diode package 16 and to regulate the TEC unit 34, the power supply 14 can include microprocessor controlled electronics as desired. A standby and enable switch 38 is also preferably electrically connected to the battery pack 30 such that the on/off switch 36 is inoperable unless the enable switch 38 is placed in a "standby" position. Thus, the operator must place the laser flashlight 10 into a "standby" mode before it can be turned on.

Figure 10:
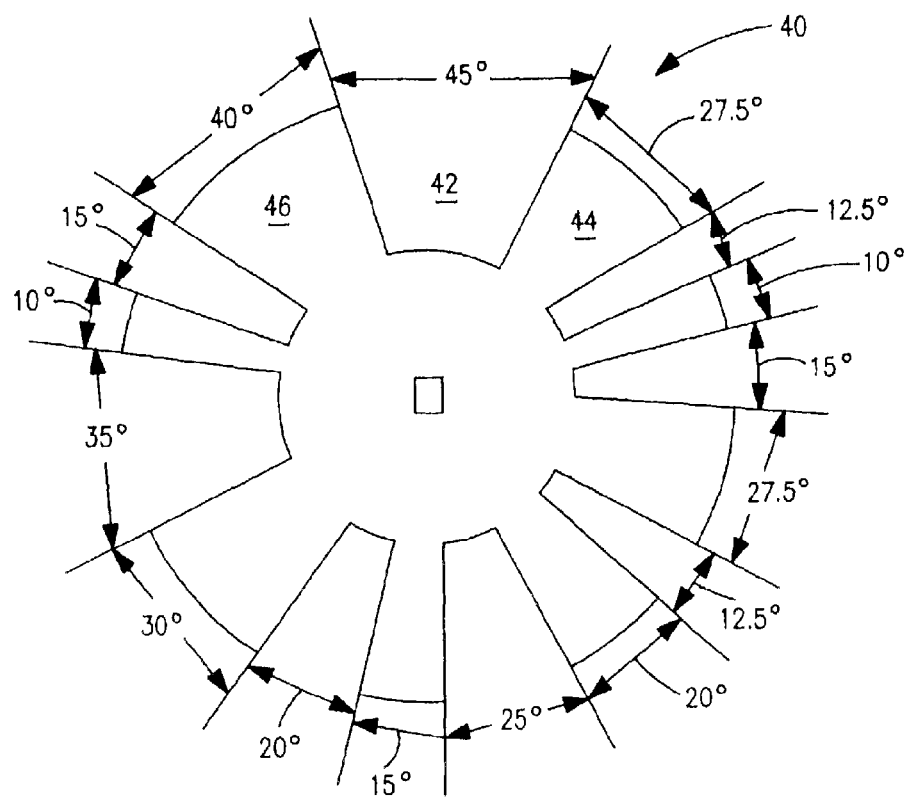
FIG. 10 is a front view of an exemplary pulse wheel which may be electronically incorporated into the present invention.

As noted above, the power supply electronics can be used to either periodically or randomly interrupt the flow of electricity from battery pack 30 to diode package 16. For example, the power supply 14 can include electronics which will periodically pulse electricity from battery pack 30 to diode package 16 at a rate of 20 hertz with a 50% duty cycle to create a strobe-like effect. Naturally, these electronics are also be powered by battery pack 30 and the frequency and duty cycle can be varied as desired. For example, with reference to FIG. 10, the electronics may pulse the diode package at a pulse sequence which is equivalent to a mechanical wheel 40 used to mechanically convert a continuous wave laser beam to a pulsed beam. The wheel 40 may be conceptually envisioned as having notches 42 in the outer perimeter 44 which define a series of radially extending tabs 46. The pulse wheel 40 is positioned such that the outer perimeter 44 of the wheel 40 is in the path of a light beam. It should be appreciated that the light beam is alternately blocked and then allowed to pass as the pulse wheel 40 rotates and the tabs 46 and notches 42 pass through the light beam. In the preferred embodiment, the arc width of tabs 46 and notches 44 are selected to produce an intermittent asymmetric pulse. The pulse wheel 40 shown in FIG. 10 has a 50% duty cycle and produces a 20 cycle flicker at 120 RPM. Experimentation has shown that such a flicker sequence is extremely disorienting to most people.

The diode package 16 is disposed within the cylindrical body along axis A such that laser beams emitted therefrom will be directed towards the aperture 24 of housing 12. Naturally, the power supply 14 and the battery pack 30 are disposed rearwardly of diode package, i.e., towards first end 22 of housing 12, so as not to optically interfere with laser beams produced by the diode package 16. A diode 48 which operates at 808 nanometers (nm) and which produces approximately one to four watts of power is preferably used. Diode package 16 includes a high-heat-load (HHL) package that is moisture sealed and contains TEC unit 34 for adjusting the diode operating temperature and, thus, its wavelength to match the absorption of the laser crystal. However, a variety of other diode packages could be utilized with the present invention. While the diode package 16 is preferably supplied electricity from battery pack 30 on a continuous basis when laser flashlight 10 is in an "on" condition, the diode package 16 could be pulsed at appropriate rates as desired to prolong the operating life of batteries and/or produce pulsating effects as desired.

Laser beams exiting the diode package 16 are focused into the laser crystal of the optical system 50 to excite laser emission from the resonator 18. The beam expander 20 preferably includes a plurality of light transmissive lenses 52, 54, 56, 58 to disperse the laser beam delivered thereto by the resonator 18, whereby laser flashlight 10 emits an eyesafe light dispersion pattern into the ambient environment at the aperture 24. Lenses 54, 56, 58 may be aspheric. Outer lens 52 is a flat element which preferably ensures a tight seal with shell 26 and does not optically distort light passing therethrough. Lenses 54 and 56 are preferably concave-convex to ensure a wide dispersion pattern of light passing therethrough. Additionally, lens 58 is preferably concave, both in the direction of and in the direction opposite to the travel of light the rethrough (i.e. double concave) to, once again, maximize light dispersion. As shown in FIG. 1, lenses 52, 54, 56, 58 are axially disposed about axis A. Lenses 52, 54, 56, 58 function as a group to disperse laser beams transmitted from the resonator across the first end to ensure compliance with the Food and Drug Administration CDRH requirements for eye safety. Accordingly, the laser beam emitted from the front surface 60 of lens 52 is eyesafe throughout its extant.

The best guidance in matters pertaining to damage in the human eye from laser sources is provided by the American National Standards Institute (ANSI) laser safety standard ANSI Z136.1-1993. The retinal damage threshold in general depends upon the laser wavelength, the exposure duration, and whether or not the laser is operated in continuous wave or pulsed or modulated mode and, if pulse operated, the repetition rate and the pulse duration. Damage thresholds and maximum permissible exposure (MPE) are usually calculated for a dark-adapted or a fully dilated eye whose pupil is 7 mm in diameter. Lasers of the type used in the subject invention are continues wave or modulated. To assess the eye-safety issue for these lasers, it is necessary to calculate the intensity (W or $mW/cm^2$) at the location of the eye and the exposure duration.

Figure 2:
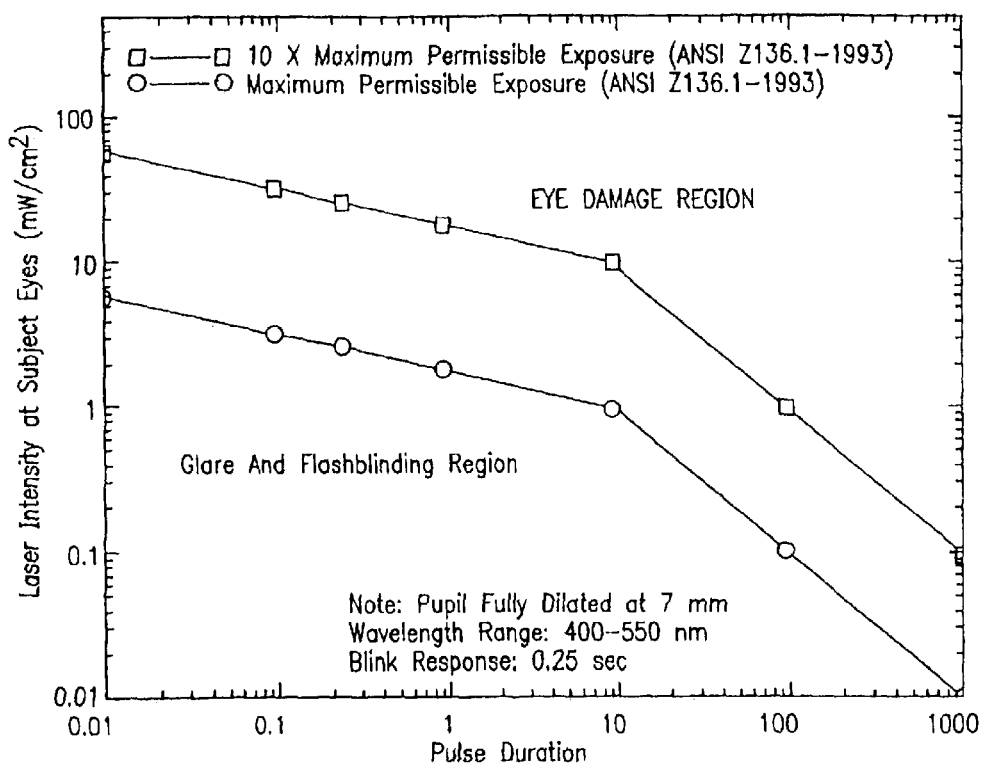
FIG. 2 is a chart illustrating the laser intensity at the eyes of a subject as a function of pulse duration required to achieve either the glare and flashblinding region or the eye damage region in accordance with an accepted laser safety standard.

FIG. 2 shows the MPE and ten times the MPE, for the range of blue and green wavelengths (400–550 nm) as a function of pulse or exposure duration according to ANSI Z136.1-193. It can be seen that the damage threshold decreases as exposure duration increases. The glare region occurs below the ANSI standard curve whereas flashblinding or dazzling occurs in the upper region near the ANSI curve and between the ANSI curve and the 10 times or damage threshold curve. For a 10 msec (0.01) second exposure, approximately the minimum needed to produce glare or flashblinding, the damage threshold is approximately 56.9 $mW/cm^2$ (0.0569 $W/cm^2$). For a 0.25 sec exposure, which characterizes the typical blink response in humans, the damage threshold is approximately 26.0 $mW/cm^2$. The ANSI standard for these two cases gives 5.69 and 2.60 $mW/cm^2$, respectively.

The laser flashlight 10 can be used to induce a number of aversion responses in subjects or individuals that can provide a substantial advantage to the user. One aversion response is for the subject to immediately turn away from the source of the bright light. This is a substantial advantage for the user, especially in dealing with armed or dangerous individuals. Another response is for the subject to delay any further action or to hesitate, providing the user with time to assess the appropriate responses. One cause of the delay is because a subject wants to see the source of the bright light but cannot see around the bright beam. In effect an illuminated individual sees an "optical wall" of light, thus protecting the user. Some illuminated individuals experience dizziness or vertigo. This is especially true when the laser flashlight is modulated at a random or asymmetric rate.

The laser flashlight 10 may be used for crime-scene investigation, particularly in connection with identifying the location of fingerprints. The green laser flashlight operating near 532 nm is particularly useful since it can be used to cause various Rhodamine or other dyes to fluoresce in the visible region. Such dyes are routinely used in fingerprint dusting powders. The blue region of the spectrum can also be used to excite other dyes of interest. A green laser flashlight is more effective in providing illumination in a smoke filled environment than an ordinary flashlight. A laser flashlight 10 operating in the green region near 532 nm is very effective in underwater applications since it is near the peak transmission of water, allowing a larger penetration depth than a common flashlight.

Figure 4:
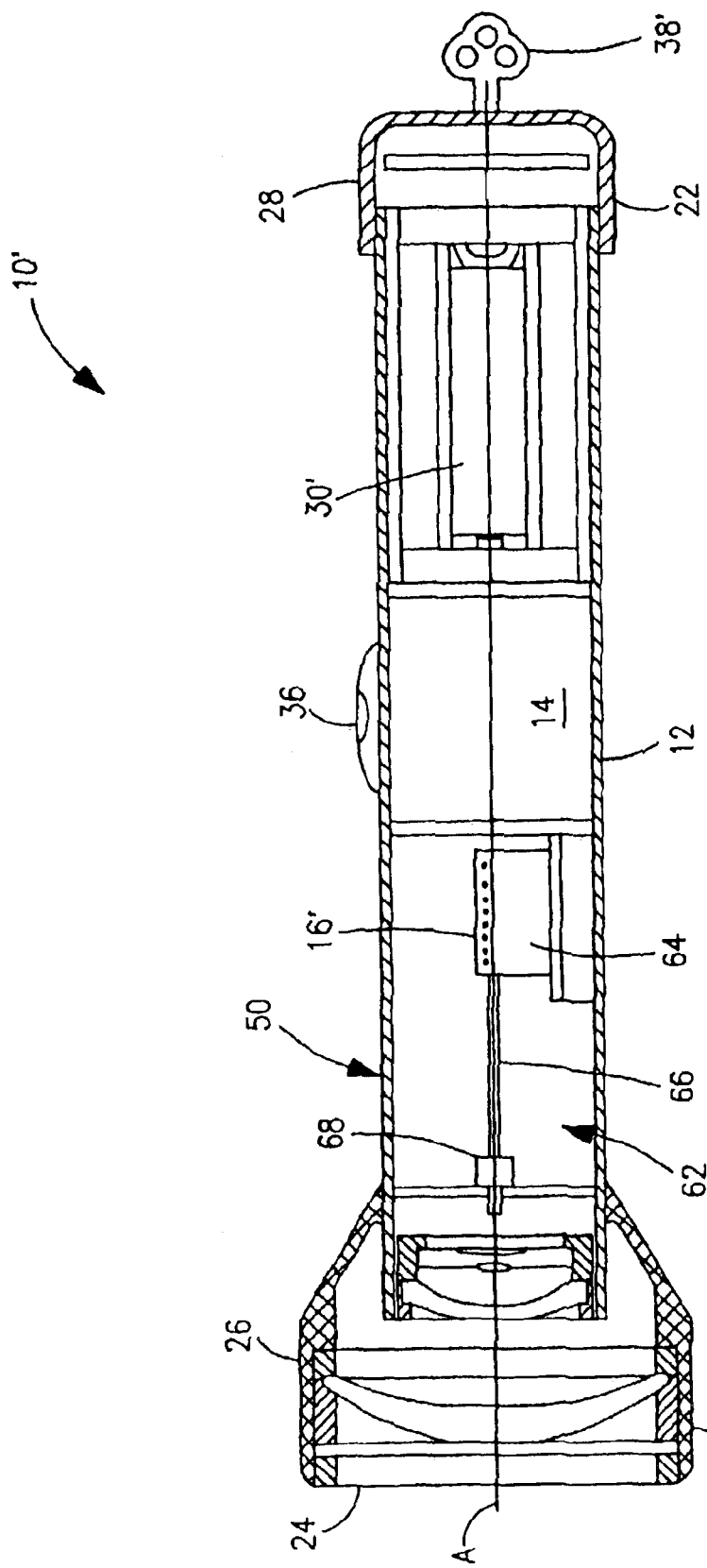
FIG. 4 is a cross-sectional elevation view of another preferred embodiment of the laser flashlight of the present invention.

An alternative preferred embodiment of the laser flashlight of the instant invention is depicted in FIG. 4. As shown therein, laser flashlight 10' includes a battery pack 30', a power supply 14, a beam expander 20, an optical system 50' including an optical fiber assembly 62 and a diode package 16'. The primary difference between laser flashlight 10' and laser flashlight 10 is that laser flashlight 10' utilizes a diode laser 64 which is directly coupled to beam expander 20 via optical fiber assembly 62 to generate laser beams rather than the diode-pumped solid-state laser of the FIG. 1, embodiment. The optical fiber assembly 62 includes an optic fiber 66 and a fiber optic connector 68. Diode lasers 64 of this nature are becoming increasingly available in higher and higher power ratings for various wavelengths, including the green range.

Since the output of a diode laser 64 can be converted to other wavelengths via many of the non-linear resonators described below, the laser flashlight 10' could, optionally, be equipped with a suitable resonator depending on the diode laser 64 selected. However, this laser flashlight configuration is preferred due to its simplicity and its power, weight and size minimization capabilities. Diode lasers 64 of comparable power and frequency ratings to those discussed above are preferred for use with this embodiment. Finally, since there is no need to cool optical fiber 66 (i.e., there is preferably no resonator to cool in this embodiment), battery pack 30' can be modified to utilize still fewer batteries.

The various components of the laser flashlights 10, 10' are, as shown, sized, shaped and oriented such that laser flashlight 10, 10' generally mimics the size, shape, weight and function of a "standard issue" incandescent flashlight used by law enforcement personnel. Accordingly, the handheld laser flashlight 10, 10' of the instant invention can be used as a non-lethal weapon in the manner that "standard issue" incandescent flashlights are so used. Laser flashlights 10, 10' can also be configured in a sealed water-tight manner so that it can be operated under water and in inclement weather.

Figure 3:
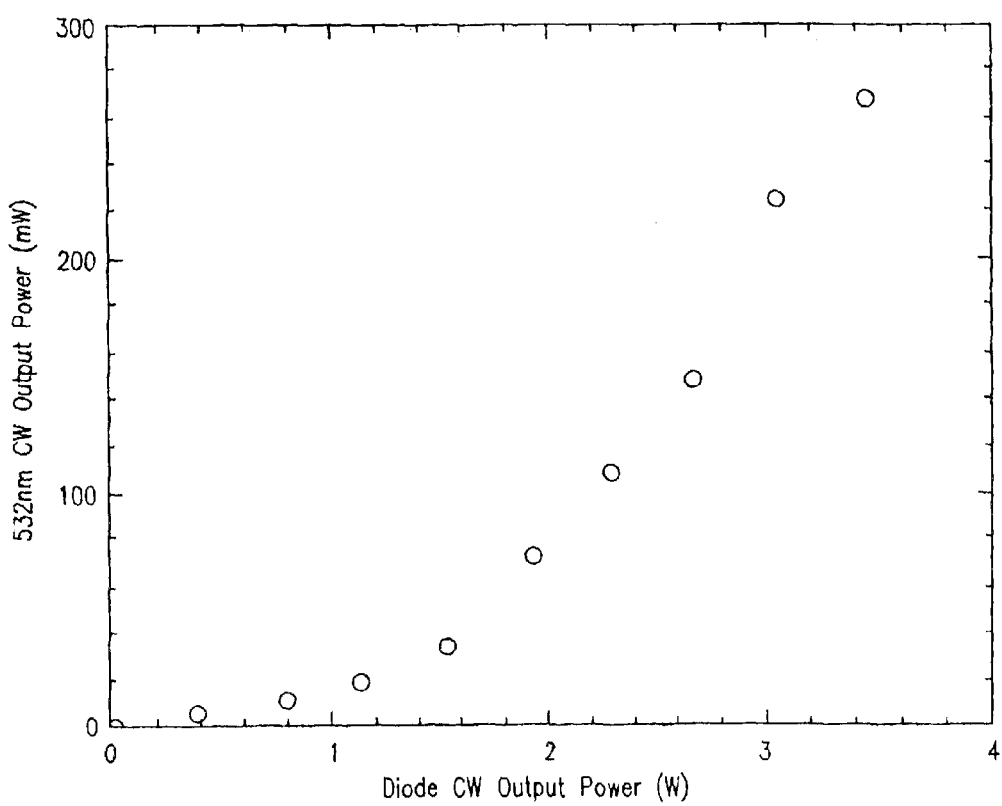
FIG. 3 is a chart illustrating the output power of the laser flashlight of FIG. 1 as a function of diode output power.
Figure 5:
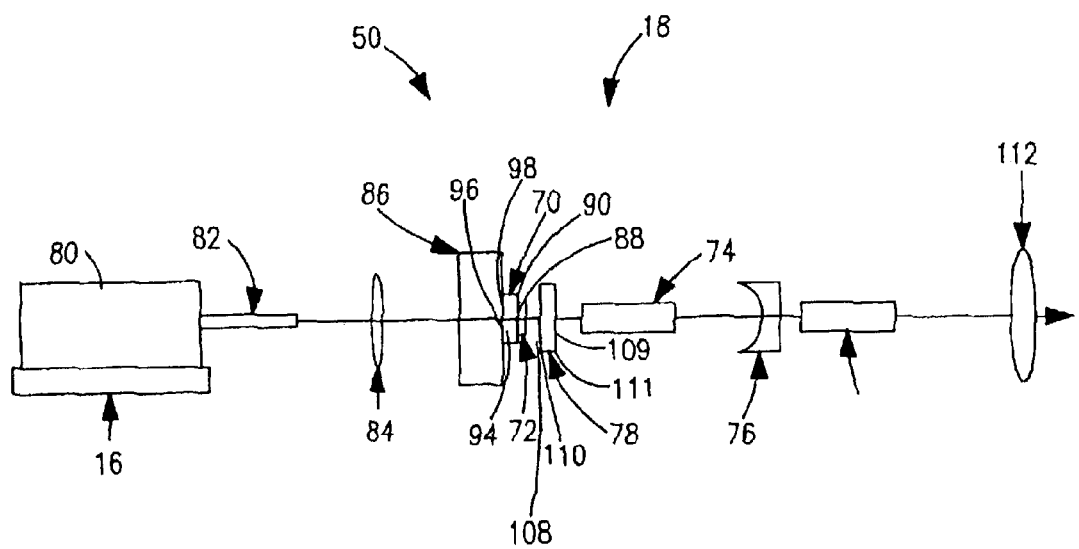
FIG. 5 is a schematic representation of a first embodiment of a green light solid state laser and diode for use with the present invention.

With reference to FIG. 5, the optical system 50 preferably includes a sapphire crystal window 70 to dissipate heat, a laser crystal 72, and a harmonic generating crystal 74 for shifting the fundamental lasing wavelength of the resonator 18. In the embodiment shown in FIG. 5, the resonator 18 first shifts the wavelength of the laser beam from 880 nm to an intermediate wavelength of 1064 nm. A second harmonic generating crystal 74 shifts the wavelength of the laser beam from the fundamental intermediate wavelength of 1064 nm to 532 nm (green light). To completely utilize the green light, the green light traveling backwards toward the laser crystal 72 must be turned around and made to co-propagate with the green light traveling toward the outcoupler 76. A "green trapping mirror" or harmonic high reflector 78 may be disposed between the laser crystal 72 and the harmonic generating crystal 74. FIG. 3 illustrates the output power attainable by the laser flashlight 10 of FIG. 1 as a function of diode output power.

Other non-linear schemes can also be used such as tripling, quadrupling sum-frequency generation, parametric oscillation, Raman conversion, etc., to produce a wide variety of different wavelengths useful for different purposes. Additionally, laser materials capable of operating at different wavelengths can be utilized to provide the further flexibility of operation at the various transition points offered thereby. For example, Nd:Vanadate or Nd:YAG laser crystals have additional transitions located in the vicinity of 920 nm and 1350 nm. Long term fluctuations in output power can be minimized by utilizing a TEC on the non-linear crystal.

FIG. 5 illustrates a first embodiment of a green light solid state laser and diode 80 for use in laser flashlight 10. An optical fiber 82 is mated or pigtailed to the diode 80. Typically the optical fiber 82 will be only a few centimeters long. The diode 80 can emit up to 4 watts of continuous wave pump power near 808 nm, for example. The optical fiber 82, which typically can have 90% transmission, is usually a clad multimode silica fiber with a core diameter between 100–600 $\mu$m and a numerical aperture (NA) of 0.22. For higher power versions of the flashlight 10, the single diode 80 can be replaced by an array or a bar of laser diodes, thereby providing fiber output powers of up to 20 watts or more continuous wave.

A single lens 84 may be used to collect the diode light and image it with unity magnification into the Nd:YVO$_4$ (vanadate) laser crystal 72, thereby providing an excitation spot having a diameter which is essentially equal to the fiber core diameter. Alternatively, one or more lenses may be used to produce a spot diameter in the vanadate laser crystal 72 which is smaller than the fiber core diameter. The smallest spot size that can be achieved is determined by the beam-quality of the diode light emerging from the fiber 82, which is typically multimode and far from the diffraction-limit. Excitation spots having spot diameters between about 50 and 600 $\mu$m are easily produced, depending on the diode source 16 and the focusing system 84. The smallest spot sizes produce the highest laser efficiency.

The vanadate laser crystal 72 may be only 1–2 mm thick and have a Nd doping that is large enough to absorb most or all of the diode light. The vanadate laser crystal 72 is arranged to be in intimate contact with a sapphire window 70 whose purpose is to draw the heat out of the vanadate and transfer it to the heat sink 86 which is preferably oxygen-free Cu. The thermal conductivity of vanadate is very low (0.05 W/cm-K) while that of sapphire is 5.6 times greater (0.280 W/cm-K). Because sapphire is a clear optical material the vanadate laser crystal 72 is optically-pumped through the sapphire crystal 70. The predominant thermal gradients with this arrangement are in the longitudinal or axial direction or the optical axis A of the laser. Consequently, the thermal gradients do not affect beam-propagation and the laser is insensitive to thermal effects over a wide range of input powers. The face-cooled laser is described in greater detail in U.S. patent application Ser. No. 08/857,700, filed May 16, 1997 and U.S. patent application Ser. No. 09/093,508 filed Jun. 8, 1997, which are hereby incorporated by reference.

The front face 90 (facing outcoupler 76) and the rear face 96 of sapphire crystal 70 are each coated 88, 98 with an anti-reflective (AR) material around 808 nm to eliminate reflective losses of resonator light. The rear face 92 of the vanadate laser crystal 72 is coated 94 with a material that is highly-transmissive (HT) at the diode wavelength but which is also a highly-reflective (HR) at the laser transition of interest and the harmonic wavelength. In a first example, coating 94 may be highly-reflective at 1064 nm and 532 nm. In a second example, coating 94 may be highly-reflective at 945 nm and 473 nm.

The outcoupler 76 may have two variations. The first variation is preferred when it is desirable to have the laser operate at a fundamental laser transition, in which case the curved, rear face 100 of the outcoupler 76 is coated 102 with a partially-reflective (PR) material at the laser wavelength. The second variation is preferred when it is desirable to use an intra-cavity nonlinear crystal like that shown in FIG. 5 to frequency double the fundamental laser transition into the visible region. In that case the curved, rear face 100 of the outcoupler 76 is coated 102 with a material which is HR at the fundamental wavelength and HT at the frequency doubled wavelength. The front, output face 104 of the outcoupler 76 is coated 106 with a material which is AR at either the fundamental or the second-harmonic wavelength, depending upon whether the first or second variation is used.

The outcoupler substrate material is typically fused silica but can also be any other transmissive optical material such as glass, sapphire, or other. The nonlinear harmonic generation crystal 74 is placed inside the resonator 18 to convert the laser light from a fundamental frequency and wavelength to a harmonic frequency and wavelength. In a preferred embodiment, the harmonic generation crystal 74 is a second harmonic generation crystal for converting a fundamental wavelength of 1064 nm to a harmonic wavelength of 532 nm. The conversion efficiency is highest for intra-cavity operation since the fundamental intensity inside the resonator 18 is many times higher than what could be obtained by operating the laser at the fundamental wavelength and then focusing the output into an external nonlinear crystal. The conversion efficiency from the fundamental to the second-harmonic is critically dependent upon the intensity of the fundamental beam.

A harmonic high reflector 78 or mirror, for example a second-harmonic reflector, may be positioned between the laser crystal 72 and the harmonic generation crystal 74 to increase the efficiency of the flashlight 10. The rear face 108 (facing the diode) of the mirror 78 is coated 110 with a material which is AR at the fundamental wavelength. The front face 109 of the mirror 78 is coated 111 with a material which is AR at the fundamental wavelength and HR at the second-harmonic wavelength. When employed, the mirror 78 collects most of the backwards traveling second-harmonic light and transmits it coincident with the forward traveling light, thus increasing the conversion efficiency and overall laser efficiency.

The fundamental or harmonic beam emerging from the laser resonator 18 is very intense and usually not eye-safe. To make the laser eye-safe, a beam expander 20 functions as an optical group to first increase the beam diameter and then collimate it or produce a beam diverging from the objective lens 112 at a desired divergence. The diameter of the laser beam impinging the input surface of the expander is less than the diameter of the laser beam at the exit surface of the beam expander. Because the beam is always collimated or diverging after the objective lens 112, it is always eye-safe after the front surface 60 of lens 52 and any distance beyond.

This is one of the key design features. The lenses 112 and 114 or 52, 54, 56, 58 of FIG. 1 used for the beam expander can consist of two or more of conventional or non-conventional design and may be spherical or aspherical. In one preferred embodiment, a gradient index (GRIN) or an aspheric lens 114 is used to rapidly expand the beam. Collimation is then achieved by using the objective lens 112. Since the GRIN or aspheric lens 114 can be designed to have a large NA, the distance between that lens 114 and the objective lens 112 is minimized, allowing the laser flashlight 10 to be of minimal length. The use of conventional spherical lenses would result in a much longer beam expander.

The resonator 18 is a hemispherical type, defined by the flat rear surface 92 of the vanadate laser crystal 72 and the curved rear face 100/104 of the outcoupler 76. An optimal design provides an output beam that is a Gaussian or fundamental $TEM_{00}$ mode. This may be achieved by choosing the resonator spacing and outcoupler curvature so that the minimum waist or spot diameter, located at the rear face 92 of the vanadate laser crystal 72, is approximately matched to the excitation spot diameter of the diode light. The beam diameter inside the resonator 18 is minimum at the rear surface 92 of the laser crystal 72. Consequently, the nonlinear harmonic generation crystal 74 is placed as close as possible to the laser crystal 72 so that the fundamental intensity is maximized. In practice, it has been found that short resonators in the range of 1–3 cm and outcoupler curvatures in the range of 5–15 cm are optimum for maximizing the laser efficiency and producing a diffraction-limited fundamental output beam.

It should be appreciated that other extensions of this technology can be made, for example to incorporate intra-cavity third or fourth harmonic generation or an intra-cavity optical parametric oscillator. It is also possible to include dispersive elements for tuning the output of tunable solid-state laser materials to different output wavelengths. Lasers of the type shown in FIG. 5 may be operated at more than one wavelength simultaneously.

Figure 6:
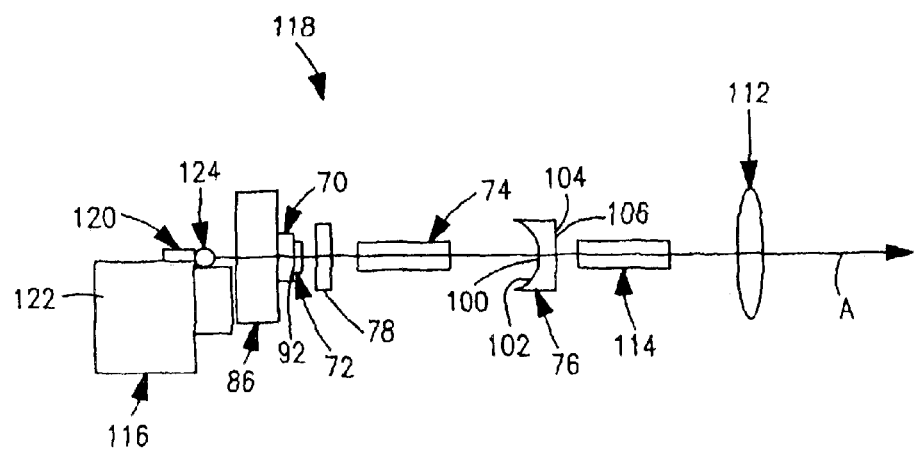
FIG. 6 is a schematic representation of a second embodiment of a green light solid state laser and diode for use with the present invention.

The embodiment illustrated in FIG. 6 is similar to that shown in FIG. 5 except that the diode source 116 and optical system 118 for delivering the diode light have been modified to eliminate the need for the focusing lens(es) 84 of FIG. 5, thereby shortening the device. Laser diodes have a very astigmatic output pattern and diverge rapidly (typically 35–45° full-width at half-maximum (FWHM)) perpendicular to the thin diode stripe on the diode output (front) face and more slowly in the direction parallel to the stripe (typically 8–12° FWHM). The diode stripe is typically 1 $\mu$m thick and 50–300 $\mu$m wide for a multimode device. In the embodiment of FIG. 6, a laser diode 120 mounted on a heat sink 122 has a collimating lens 124 attached to it close to the diode output face. The lens 124 may be collimating in both parallel and perpendicular directions and can produce an output beam that is collimated or with nearly equal divergence in both directions. For the design shown in FIG. 6 the diode light is collimated in both directions and the diode output beam profile is typically close to a square. The diode assembly 116 and collimating lens 124 are placed as close as possible to the vanadate laser crystal 72. By eliminating focusing optics the configuration shown in FIG. 6 is more compact than that of FIG. 5. In addition lens losses are eliminated. This increase in efficiency is somewhat mitigated however by some of the diode excitation being lost since the extracting beam is round, not square.

Figure 7:
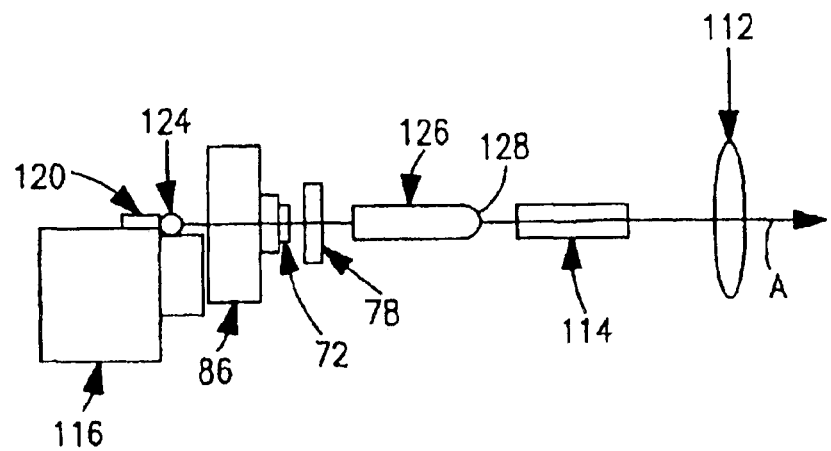
FIG. 7 is a schematic representation of a third embodiment of a green light solid state laser and diode for use with the present invention.

In the embodiment shown in FIG. 7, the outcoupler of FIG. 6 has been eliminated by placing the curvature required to make the resonator stable and mode match the internal mode to the diode spot diameter, on the nonlinear harmonic generation crystal 126. As shown in FIG. 7, the front face 128 of the nonlinear harmonic generation crystal 126 has a convex-shape to provide the proper curvature. The harmonic high reflector 78 can also be eliminated in the embodiments shown in FIGS. 5–7 by placing a coating 94, which is HR for both the fundamental and harmonic wavelengths, directly on the rear face 92 of the laser crystal 72. This configuration is the simplest and occupies the least amount of linear distance of any of the embodiments discussed thus far.

Figure 8:
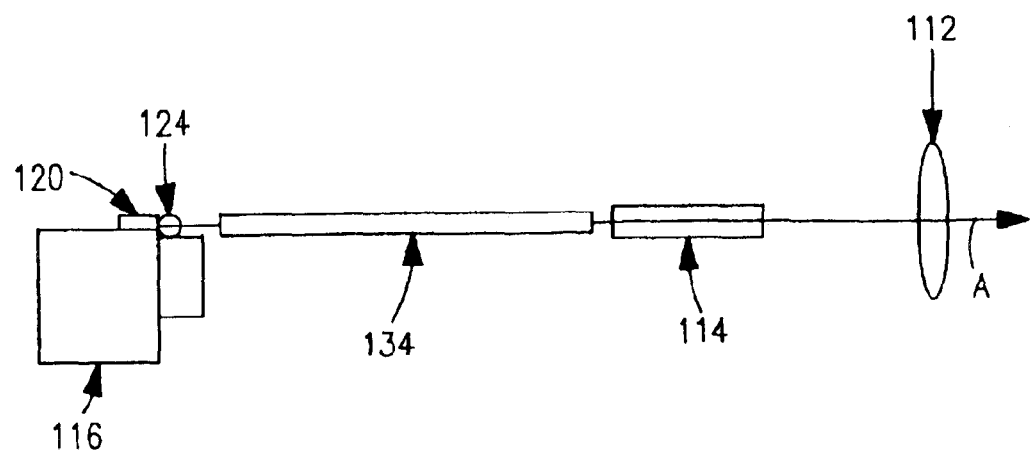
FIG. 8 is a schematic representation of a fourth embodiment of a green light solid state laser and diode for use with the present invention.

FIG. 8 illustrates a fourth embodiment of a green light solid state laser and diode for use in laser flashlight 10 in which the solid-state laser resonator has been eliminated altogether. The output of the diode 120 is collimated by passage through a collimating lens 124. The astigmatic nature of the laser light is eliminated by letting the collimated output propagate through a length of multimode optical fiber 134 where the output is completely homogenized and circular due to the mixing and excitation of numerous propagation modes in the fiber 134. If the numerical aperture of the fiber 134 is large enough the diode light is simply allowed to diverge where it is collimated and made eye-safe using an objective lens 112. If the numerical aperture is not large enough, however, a GRIN or other lens 114 can be inserted to increase the divergence. The optical fiber 134 may also be eliminated if output homogeneity is not that important. The objective lens 112 then will also act as an aperture and produce a circular output beam at the expense of laser efficiency since part of the square output beam from the collimating lens 124 will be lost.

Figure 9:
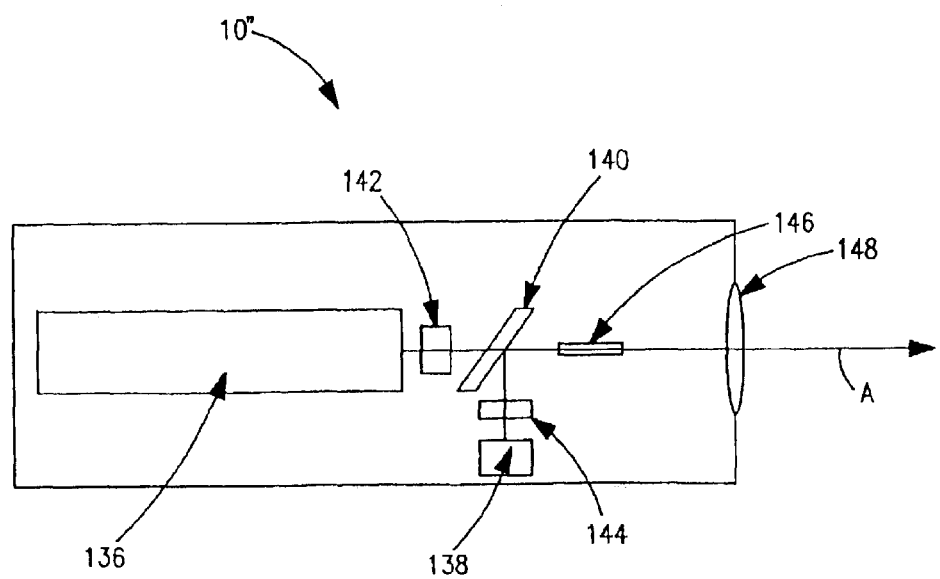
FIG. 9 is a schematic representation of dual-color laser and diodes for use with the present invention.

An alternative to using the diode package as described above is to utilize a plurality of diode packages of either the same or different frequencies. This alternative provides for the possibility of producing laser beams of multiple frequencies simultaneously. With reference to FIG. 9, a flashlight 10" in accordance with the invention may produce a dual wavelength laser output in the visible region. A frequency-doubled, green 532 nm $Nd:YVO_4$ laser 136 is combined with a red diode laser 138 operating in the 630–670 nm spectral range. An integrated power supply 14 may provide excitation to either laser separately or at the same time. Combining the output from both lasers 136, 138 is achieved with a polarizer 140. Preferably, polarizer 140 transmits all of the green 532 nm light for "s" polarization (in the plane of the Figure) and reflects all of the red 630–670 nm light which has "p" polarization (perpendicular to the plane of the Figure). Alternatively, polarizer 140 may transmit all of the green 532 nm light for "p" polarization and reflect all of the red 630–670 nm light which has "s" polarization. Beam forming optics 142, 144, which comprise various reflective or refractive optics, are used to manipulate the output of both lasers 136, 138, providing the proper beam shape, size and divergence so that both may be arranged to enter the first beam expander lens 146. The first and second beam expander lenses 146, 148 expand both the coincident and parallel beams and transmit a laser beam from the enclosure. The design of the flashlight 10" must take into account the effect of the different refractive power of optical elements such as lenses 142, 144 for the two different wavelengths of laser light.

In embodiments employing a plurality of diode-pumped lasers, the various diodes may be operated in a continuous wave mode and/or in a modulated mode, i.e., the diodes could be operated in either continuous wave or modulated modes independently of one another. As yet another alternative, a diode package can be operated to generate laser beams at a plurality of wavelengths.

While the present invention has been described in connection with what is presently considered to be the most practical and preferred embodiments, it is understood that the invention is not limited to the disclosed embodiments.

What is claimed is:

1. A hand-held laser flashlight comprising:
   a housing having a light emission surface;
   a coherent light source disposed within the housing, said coherent light source emitting a coherent light beam;
   a power supply coupled to said coherent light source;
   an optical system disposed within said housing, said optical system having an optical system input and an optical system output, wherein said coherent light beam enters through said optical system input, and wherein a laser beam with a substantially gaussian spatial profile exits through said optical system output; and
   a beam expander disposed within said housing, said beam expander having a beam expander input and a beam expander output, wherein said laser beam enters through said beam expander input, and wherein an intensity controlled light beam exits through said beam expander output and through said light emission surface, said intensity controlled light beam having a beam intensity of less than 26 mW/cm$^2$.

2. A hand-held laser flashlight comprising:
   a housing having a light emission face;
   a diode light source disposed within the housing, said diode light source emitting a coherent light beam toward said light emission face along an optical axis;
   a power supply coupled to said diode light source;
   an optical system disposed within the housing along the optical axis intermediate said diode light source and said light emission face, said optical system outputting a laser beam toward said light emission face with a substantially gaussian spatial profile; and
   a light transmissive beam expander disposed along the optical axis intermediate said optical system and said light emission face, the laser beam traversing said light transmissive beam expander and exiting an exit surface of said light transmissive beam expander as an output laser beam, said light transmissive beam expander configured to limit a beam intensity corresponding to said output laser beam to less than 26 mW/cm$^2$.

3. The laser flashlight of claim 2, wherein the diode light source is comprised of a plurality of laser diodes.

4. The laser flashlight of claim 2, wherein the optical system further comprises a resonator, said resonator comprised of an active gain element pumped by the diode light source.

5. The laser flashlight of claim 4, said resonator further comprising a harmonic generating crystal, the active gain element receiving the coherent light beam emitted by the diode light source and emitting an intermediate laser beam having an intermediate wavelength, wherein said harmonic generating crystal shifts the intermediate wavelength to an output wavelength corresponding to the output laser beam.

6. The laser flashlight of claim 4, further comprising:
   an optically transmissive heat conductive element in thermal contact with said active gain element; and
   a heat sink in thermal contact with said optically transmissive heat conductive element.

7. The laser flashlight of claim 6, wherein the optically transmissive heat conductive element has opposed first and second end surfaces, said first and second end surfaces coated with an anti-reflection coating.

8. The laser flashlight of claim 5, wherein the active gain element is a laser crystal having opposed first and second axially spaced end surfaces, the first end surface of the laser crystal facing the diode light source and coated for high transmission at a wavelength corresponding to the coherent light beam and for high reflectivity at the intermediate and output wavelengths.

9. The laser flashlight of claim 5, wherein the resonator further includes an output coupler having an input end surface coated for high reflectivity at the intermediate wavelength and for high transmission at the output wavelength.

10. The laser flashlight of claim 4, wherein the resonator further includes an output coupler having an input end surface coated for partial reflectivity at the output laser beam wavelength.

11. The laser flashlight of claim 5, wherein the resonator further comprises an optically transmissive harmonic mirror element axially disposed intermediate the active gain element and the harmonic generating crystal, the harmonic mirror having opposed first and second axially spaced end surfaces, the second end surface of the harmonic mirror facing the harmonic generating crystal and being coated for high transmission at the intermediate wavelength and for high reflectivity at the output wavelength.

12. The laser flashlight of claim 5, wherein the harmonic generating crystal has an end surface facing the active gain element, the end surface of the harmonic generating crystal being coated for high transmission at the intermediate wavelength and for high reflectivity at the output wavelength.

13. The laser flashlight of claim 5, wherein the harmonic generating crystal has a substantially flat first end surface and a convex-shaped second end surface, the first end surface facing the active gain element.

14. The laser flashlight of claim 2, wherein the light transmissive beam expander further comprises at least one collimating lens and a gradient index or aspheric lens disposed along the optical axis.

15. The laser flashlight of claim 3, wherein the diode laser source further comprises an optical fiber disposed intermediate the diode laser source and the optical system.

16. The laser flashlight of claim 2, wherein the diode laser source further comprises a diode array and a collimating lens for receiving, collimating and transmitting the coherent light beam emitted by the diode laser source.

17. The laser flashlight of claim 2, wherein the optical system further comprises an optical fiber having a first end for receiving the coherent light beam emitted by the diode laser source and a second end for transmitting the coherent light beam to the light transmissive beam expander.

18. The laser flashlight of claim 17, wherein the light transmissive beam expander comprises a gradient index or aspheric lens.

19. The laser flashlight of claim 2, further comprising means for pulsing the output laser beam.

20. The laser flashlight of claim 2, wherein the output laser beam has a spatial profile that is substantially TEM$_{00}$ mode.

21. A laser flashlight comprising:
   a housing having a light emitting end;
   an emitter disposed within the housing emitting a coherent light toward the light emitting end of the housing along an optical axis upon the application of electricity;
   a power supply for selectively applying electricity to the emitter;
   an optical resonator disposed within the housing and along the optical axis, the optical resonator intermediate the emitter and the light emitting end of the housing, the optical resonator comprising:

a laser element pumped by the emitter;

a frequency converter; and coupling optics, the optical resonator producing an output laser beam with a spatial profile that is substantially $TEM_{00}$ mode; and a light transmissive beam expander disposed proximate to the light emitting end of the housing and along the optical axis, the light transmissive beam expander receiving and dispersing the output laser beam, wherein said light transmissive beam expander is configured to limit a beam intensity corresponding to said output laser beam to less than 26 mW/cm$^2$.

22. The laser flashlight of claim 21, wherein the frequency converter comprises at least one harmonic generating crystal.

23. A laser flashlight comprising:

housing means, said housing means having a light emitting end;

means disposed within the housing means for emitting a coherent light toward the light emitting end of the housing means along an optical axis;

means for selectively applying electricity to the coherent light emitting means;

means disposed within the housing means for receiving the coherent light and emitting an output laser beam with a spatial profile that is substantially $TEM_{00}$ mode; and means disposed proximate to the light emitting end for receiving and dispersing the output laser beam, said receiving and dispersing means configured to limit an intensity corresponding to said output laser beam to less than 26 mW/cm$^2$.

24. The laser flashlight of claim 23, further comprising means for pulsing the output laser beam.

25. The laser flashlight of claim 24, wherein the means for pulsing the output laser beam selectively interrupts the output laser beam to produce intermittent asymmetric laser beam pulses.

* * * * *